United States Patent Office 3,346,428

Patented Oct. 10, 1967

3,346,428

METHOD OF MAKING SEMICONDUCTOR DEVICES BY DOUBLE DIFFUSION

Iwao Teramoto, Ibaraki-shi, Hitoo Iwasa, Toyonaka-shi, and Shosuke Shinoda, Ibaraki-shi, Japan, assignors to Matsushita Electronics Corporation, Osaka, Japan, a corporation of Japan No Drawing. Filed Feb. 15, 1965, Ser. No. 432,858

Claims priority, application Japan, Feb. 27, 1964, 39/11,190

9 Claims. (Cl. 148—188)

This invention relates to methods of making semiconductor devices and particularly to those in which a p-n junction is formed by diffusing impurities into the semiconducting material through its surfaces.

Formation of a p-n junction in a semiconductor is generally accomplished by alloying or diffusion. The diffusion method, with which the present invention is concerned, is performed by either of the two processes, open-tube and sealed-tube, in accordance with the type of diffusants or impurities to be diffused and the type of atmosphere employed. In the former or open-tube process, which is generally preferred because of ease in operation, the semiconducting material and impurities in either the vapor form or the solid form are heat-treated, in an appropriate gas at about the atmospheric pressure. In the latter or sealed-tube process, impurities and the semiconducting material are heat-treated in a tube sealed in vacuum.

Silicon rectifiers having a p-n junction are ordinarily made by diffusing a donor impurity into one side of the silicon wafter and an acceptor impurity into the other side thereof for the purpose of minimizing the series resistance of the rectifiers. Usually, however, there remains in the interior of the wafer a p or n layer which is not substantially subject to diffusion and has a relatively high resistance. Conventionally, phosphorous and boron are used as a donor impurity and an acceptor impurity, respectively, which are diffused into the silicon wafer by depositing thereon phosphorus pentoxide, $P_2O_5$, and boron trioxide, $B_2O_3$, or trichloride, $BCl_3$, and then by heat-treating it. On this occasion, it is preferable that phosphorus be introduced into only one side of the wafer and boron only into the other side of the wafer. To meet such requirements, a two-step procedure has ordinarily been taken which includes a first step of forming on both faces of the silicon wafer a glassy phosphosilicate protective film, which causes diffusion of phosphorus into the wafer and precludes penetration therein of boron, and a second step of lapping one of the filmed faces followed by diffusion of boron therein.

The present invention provides an effective measure for saving time, labor and material required in such diffusion process.

Next, one example of the conventional diffusion process will be described more specifically, in which a silicon wafer of n-type low conductivity is employed with oxide films preliminarily formed on both faces of the wafer by heat-treating it in an oxygen gas flow at approximately 1100° C. for one hour.

At first, on both faces of such silicon wafer, phosphorus pentoxide is deposited at 1000° C. in an oxygen atmosphere. In this procedure, the vapor source consists of phosphorus pentoxide, in the form of solid, held at 300° C., at which temperature phosphorus pentoxide has a vapor pressure of approximately 230 mm. Hg. Thus obtained deposit of phosphorus pentoxide conceivably contains lower oxides of phosphorus as well, which also have high vapor pressures. As will readily be understood, such substances having a high vapor pressure, if left deposited on the wafer face, would act adversely upon the succeeding step of boron diffusion. Therefore, they should be transformed into substances having lower vapor pressures during the process of deposition.

According to the actual practice, a glassy film of phosphosilicate is formed directly on the surfaces of the silicon wafer. The film contains a substantial amount of phosphorus, which has a vapor pressure much lower than that of phosphorus pentoxide. This film serves to prevent the diffusion of boron through the film into the silicon wafer. The silicon wafer with such films formed thereon is heat-treated at a temperature of 1200° to 1260° C. to cause the phosphorus contained in the films to diffuse into the silicon wafer forming an n-type layer on both sides of the wafer.

Next, the n-type layer on one side of the silicon wafer is removed by lapping and a boron trioxide film is coated over the lapped face. Subsequently, the silicon wafer is heat-treated for 16 hours at a temperature in the range from 1200° to 1260° C. to cause boron coated on the wafer face to diffuse into the wafer to form a p-type layer, which together with the n-type layer previously formed produces a p-n junction.

In this process, if the glassy phosphosilicate films were not formed preliminarily, boron would diffuse into the silicon wafer through its phosphorus-diffused surface as well to transform the n-type layer partially into a p-type one. This process amounts to two separate diffusion steps, for diffusion of donor and acceptor materials, respectively, and an intervening step of lapping one face of the wafer and other steps, for example, of preoxidation, thus making the entire process complicated and wasteful.

In contrast, the present invention makes it possible to diffuse phosphorus and boron or other element simultaneously into the opposite sides of the semiconductor wafer by use of a new dopant and thus substantially simplifies the entire procedure. It may safely be considered that all the deficiencies of the conventional process are attributable to the fact that the dopants used have a high vapor pressure. Thus, to enable simultaneous diffusion into the silicon wafer of phosphorus and boron or other impurities, it is required to use a phosphorus-containing dopant which contains phosphorus and its oxides having a sufficiently low vapor pressure and which forms at the initial reaction stage a film impermeable to the vapor of the other dopant, in this instance, of boron trioxide, so that the vapor of boron or its oxide may not permeate through the phosphorus containing deposit into the silicon wafer to convert the n-type partially into p-type.

According to the present invention, this requirement is satisfied by use of a glassy substance expressed by the general formula of $l \times X_2O—mYO—nP_2O_5$, where X represents an alkali metal selected from the group including potassium, sodium and lithium; Y represents an alkali earth metal selected from the group including barium, strontium, calcium and magnesium; $l$ represents the mol percentage of the alkali metal oxide; $m$ represents the mol percentage of the alkali earth metal oxide; and $n$ represents the mol percentage of phosphorus pentoxide. The ratio $l/(l+m)$ has a value between zero and unity. For example, one of such glassy substances which is expressed by the formula, $lK_2O—mBaO—nP_2O_5$, where $n=l+m$, can be easily obtained by melting a powder mixture of potassium metaphosphate, $KPO_3$, and barium metaphosphate, $Ba(PO_3)_2$, and can be made to soften at a relatively low temperature by increasing the percentage of potassium. In addition, this glass has a substantially reduced viscosity at higher temperatures and thus can form on the semiconductor substrate a uniform film which is impermeable to boron trioxide and other dopants in vapor form. It has been found that for practical applications the glass should preferably have a viscosity of $10^2$ poises or less at the temperature of 1000° C.

As pointed out hereinbefore, it is particularly important that the film of such glassy substance is formed at the initial stage of reaction. The reason for this will now be described in more detail.

It is well known that the silicon oxide film formed by thermal oxidation forms a "mask" which is impermeable to impurities. On the other hand, it is generally thought that phosphorus pentoxide and silicon oxide, both being a glass network former, do not combine to form a glass even if they may dissolve to each other as impurities. Therefore, the masking effect, as obtained in the conventional process, is supposed to be attributable to the presence of silicon oxide rather than to the presence of phosphosilicate glass. During heat treatment, it is obvious that silicon oxide is formed also on the boron diffusing side of the silicon wafer and that such silicon oxide is combined with boron trioxide to form borosilicate glass. It will be apparent, therefore, that, where the wafer is heat-treated in an oxidizing atmosphere, a protective film is formed not only on the phosphorus-diffusing side but also on the boron-diffusing side of the wafer as the heating continues beyond a certain period of time. In other words, where the specimen is heat-treated in an oxidizing atmosphere, the problem of cross contamination is critical particularly in the early stage of the heat treatment. It will be appreciated that the use of a low-viscosity glass according to the present invention is advantageous particularly in that it is effective to prevent such cross contamination in the early stage of the heat treatment.

By analogy, it might mistakenly be expected that the formation on the boron-diffusing side of a protective film as effective as the one of phosphate glass is possible by the use of borate glass in place of boron trioxide as a dopant. However, since borate glass readily dissolves silicon oxide to form borosilicate glass, which is highly viscous, it can hardly produce any uniform film at higher temperatures. Also, if the borosilicate glass has a composition selected to minimize its viscosity, it exhibits an increased coefficient of expansion with the result that the silicon wafer will be strained to have a concave boron-diffusing side. This indicates that the borate glass can hardly be employed to serve the same purpose as the phosphate glass does.

One practical example of the present invention will next be described. Two mols of potassium metaphosphate and one mol of barium metaphosphate are mixed together and melted to form a glass, $lK_2O—mBaO—nP_2O_5$, where $l=2$, $m=1$ and $n=3$. This glass has a viscosity sufficiently lower than $10^2$ poises at 1000° C. One gram of the glass in powder form is suspended in 10 ml. of ethylene-glycol-monoethyl-ether. This mixture is applied on one face of a silicon wafer 200μ thick, and dried. Subsequently, a suspension of 2 grams of boron trioxide in 10 ml. of ethylene-glycol-monoethyl-ether is applied on the other face of the wafer and dried.

The silicon wafer thus prepared is placed in a quartz tube of approximately 30 mm. diameter, through which air flows at a rate of approximately 1000 ml. per minute and is heated from room temperature to 1280° C. in one to two hours. The wafer is heated for further 12 hours at 1280° C. and then is taken out. In this manner, an insulating film is formed on both faces of the silicon wafer.

The insulating films are then removed by immersing the wafer for about one minute in a bath of 50% hydrofluoric acid, followed by the rinsing and drying of the wafer. With the insulating films removed in this manner, the wafer is formed on its glass-coated side with a uniform n-type layer having a sufficiently low electric resistance and on the other side with a uniform p-type layer. In this example, the thickness of the n-type layer was found to be approximately 40μ. Also, no adverse effect whatsoever was found of potassium or barium upon the electrical properties of the product.

In similar examples, employing different compositions having an $l$-to-$m$ ratio of 1 to 1 and 1 to 2, also satisfactory results were obtained where the p-type layer and the n-type layer obtained substantially the same as in above example, with no adverse influence of potassium or barium upon the electrical properties of the product.

Thus, the composition of the glass usable in the present invention has a wide range.

In cases where the wafer was heat-treated for 16 hours, the thickness of the diffusion layer was found to be 19 to 23μ for the heating temperature of 1100° C., 27 to 30μ for 1200° C., 39 to 44μ for 1280° C., and 45 to 50μ for 1320° C. Thus, it has been found that the thickness of the diffusion layer is less critically dependent on the heating temperature making easy the operation of temperature control in the process.

The reason why air was employed during heat treatment as an atmosphere is because it has a more or less oxidizing effect. It has been found, however, that use of oxygen, wet nitrogen or wet argon in place of air also gives substantially the same satisfactory diffusion effect as air.

Further, as pointed out hereinbefore, the glass layer coated on the silicon wafer has some of its $SiO_2$ content dissolved therein during heat treatment. Therefore, the glass may preliminarily be mixed with $SiO_2$ as long as the viscosity of the glass is not influenced to any substantial extent. For the same reason, oxides of any element of the IV or V family, which do not adversely affect formation of an n-type conductive layer in the silicon wafer, may be mixed without any adverse influence upon the electrical properties thereof as long as the amount of such oxides does not increase the viscosity of the glass excessively. Also, such oxides have been found effective to improve the glass properties. For example, addition of 1 to 2% (by weight) of lead oxide to the above described glass has no influence upon the diffusion effect but is rather effective to make the glass more stable. Also, tin, germanium, arsenic, antimony and bismuth have substantially the same effect.

As apparent from the foregoing description, the present invention makes it possible to diffuse phosphorus and another impurity element simultaneously into the opposite sides of a semiconductor wafer by employing as a phosphorus dopant a glassy substance described herein and thus simplifies the manufacturing process to a large extent substantially improving the operating efficiency.

What is claimed is:

1. A method of producing a semiconductor device comprising applying a phosphate glass on one face of a silicon wafer, applying boron trioxide, $B_2O_3$, on the other face of the silicon wafer and heating the coated silicon wafer at a temperature of 1100° to 1300° C. to diffuse phosphorus and boron simultaneously into the respective sides of the silicon wafer; the phosphate glass having a viscosity of not more than 100 poises at a temperature of 1000° C., and comprising at least one alkali metal oxide selected from lithium oxide, sodium oxide and potassium oxide; at least one alkali earth metal oxide selected from magnesium oxide, calcium oxide, strontium oxide and barium oxide; and phosphorus pentoxide exceeding in mol percentage the sum of the mol percentages of the selected alkali and alkali earth metal oxides.

2. A method according to claim 1 in which the coated silicon wafer is heated in an atmosphere of oxygen.

3. A method according to claim 1 in which the coated silicon wafer is heated in a wet nitrogen atmosphere.

4. A method according to claim 1 in which the coated silicon wafer is heated in a wet argon atmosphere.

5. A method according to claim 1 in which the phosphate glass is a glass obtained by melting meta phosphates through the application of heat.

6. A method according to claim 1 in which the phosphate glass contains a minute amount of an oxide of at least one element selected from the group consisting of silicon, germanium, tin, lead, arsenic, antimony and bismuth.

7. A method according to claim 6 in which the coated silicon wafer is heated in an atmosphere of oxygen.

8. A method according to claim 6 in which the coated silicon wafer is heated in a wet nitrogen atmosphere.

9. A method according to claim 6 in which the coated silicon wafer is heated in a wet argon atmosphere.

References Cited

UNITED STATES PATENTS

| | | | |
|---|---|---|---|
| 2,781,481 | 2/1957 | Armstrong | 148—187 X |
| 2,974,073 | 3/1961 | Armstrong. | |
| 3,200,019 | 8/1965 | Scott | 148—187 X |
| 3,281,291 | 10/1966 | Greenberg | 148—187 |

HYLAND BIZOT, *Primary Examiner.*